(12) United States Patent
Park

(10) Patent No.: US 10,670,628 B2
(45) Date of Patent: Jun. 2, 2020

(54) TEST PROBE AND TEST DEVICE USING THE SAME

(71) Applicant: LEENO INDUSTRIAL INC., Busan (KR)

(72) Inventor: Ung-gi Park, Seoul (KR)

(73) Assignee: LEENO INDUSTRIAL INC. (KR)

( * ) Notice: Subject to any disclaimer, the term of this patent is extended or adjusted under 35 U.S.C. 154(b) by 27 days.

(21) Appl. No.: 16/047,356

(22) Filed: Jul. 27, 2018

(65) Prior Publication Data

US 2019/0041428 A1 Feb. 7, 2019

(30) Foreign Application Priority Data

Aug. 4, 2017 (KR) .......................... 10-2017-0098919

(51) Int. Cl.
*G01R 1/067* (2006.01)

(52) U.S. Cl.
CPC ................................ *G01R 1/06716* (2013.01)

(58) Field of Classification Search
CPC . G01R 1/06716; G01R 1/06722; H01L 21/30; G01N 25/005
USPC ...... 324/755.08, 754.1, 500, 754.03, 754.01, 324/754.13, 754.14, 756.03, 756.04, 324/757.04, 757.05, 754.2
See application file for complete search history.

(56) References Cited

U.S. PATENT DOCUMENTS

| 6,603,297 B1 | 8/2003 | Gessford et al. |
| 2009/0280676 A1 | 11/2009 | Weiland et al. |
| 2010/0033201 A1 | 2/2010 | Hsu et al. |
| 2010/0327894 A1* | 12/2010 | Dang ................. G01R 1/06738 324/755.11 |

(Continued)

FOREIGN PATENT DOCUMENTS

| CN | 1340714 A | 3/2002 |
| KR | 10-2009-0030543 A | 3/2009 |

(Continued)

OTHER PUBLICATIONS

Korean Office Action (KR 10-2017-0098919), KIPO, dated Aug. 9, 2018.

(Continued)

*Primary Examiner* — Melissa J Koval
*Assistant Examiner* — Trung Nguyen
(74) *Attorney, Agent, or Firm* — Park & Associates IP Law, P.C.

(57) ABSTRACT

A test probe for testing electric characteristics of an object to be tested. The test probe includes: a first contact portion; a second contact portion movable close to or away from the first contact portion; and an elastic deformation portion connecting the first contact portion and the second contact portion and elastically deformed by compression in a probe axial line direction, wherein at least one of the first contact portion and the second contact portion comprises a plurality of split contact portions separated by a first slit formed along a lengthwise direction. According to the present disclosure, (Continued)

the plurality of split contact portions are configured to independently contact the tested contact point of the object to be tested, thereby not only enhancing contact reliability but also securing contact reliability by an alternative split contact portion even though one of the split contact portions is defective or damaged.

5 Claims, 6 Drawing Sheets

(56) References Cited

U.S. PATENT DOCUMENTS

| | | | |
|---|---|---|---|
| 2015/0280345 A1* | 10/2015 | Kimura | H01R 13/2428 439/700 |
| 2016/0146884 A1 | 5/2016 | Nasu | |
| 2018/0024166 A1 | 1/2018 | Acconcia et al. | |

FOREIGN PATENT DOCUMENTS

| | | |
|---|---|---|
| KR | 10-2009-0121786 A | 11/2009 |
| KR | 10-2010-0017042 A | 2/2010 |
| KR | 10-2011-0085461 A | 7/2011 |
| KR | 10-2015-0032420 A | 3/2015 |
| KR | 10-2016-0063286 A | 6/2016 |
| TW | 201007187 A | 2/2010 |
| TW | 201640123 A | 11/2016 |

OTHER PUBLICATIONS

Korean Decision to Grant (KR 10-2017-0098919), KIPO, dated Dec. 8, 2018.
Taiwanese Office Action (TW 107125563), TIPO, dated Apr. 12, 2019.

* cited by examiner

TEST PROBE AND TEST DEVICE USING THE SAME

REFERENCE TO RELATED APPLICATIONS

This application claims the priority benefit of Korean Patent Application No. 10-2017-0098919 filed on Aug. 4, 2017, the entire contents of which are incorporated herein by reference.

FIELD OF THE INVENTION

The present disclosure relates to a test probe for testing electric characteristics of a semiconductor or the like object to be tested, and a test device using the same.

BACKGROUND OF THE INVENTION

As a test device for testing electric characteristics or adequacy of a semiconductor wafer or the like object to be tested, a test probe has been used including a plurality of probes for electrical connection between a tested contact point (terminal, bump) of the object to be tested and a testing contact point (pad) of a test circuit, and a probe card for supporting these probes.

With development of technology, the semiconductor wafer has become larger and a semiconductor has become smaller, thereby increasing the number of pads formable on one sheet of semiconductor wafer. In result, a distance between semiconductor pads has to become narrower. Likewise, there is a need of more densely arranging a plurality of probes on the probe card as a pitch between the pads becomes narrower.

In general, the probe card employs so many microelectromechanical system (MEMS) probes. During the test, the MEMS probe presses the contact point to be tested of the object to be tested against one portion toward a test circuit, and thus a middle elastic deformation portion is deformed. In this case, the other contact portion of the MEMS probe slides and moves in an opposite direction to the buckling direction of the elastic deformation portion on the pad of the test circuit (interposer), and therefore a problem arises in that the contact is not sure. Further, the conventional MEMS type probe card is diagnosed as the whole failures or defects of the probe card even when just one among the plurality of MEMS probes is defective or damaged as repetitively used in the test. Besides, the contact portion of the MEMS probe to be in contact with the tested contact points (terminal, bump and pad) of the object to be tested may be increased in contact resistance as a tip is worn or contaminated by the repetitive tests, thereby lowering reliability.

The plurality of MEMS probes are mounted to upper and lower support members arranged in parallel leaving a space therebetween. In this case, one contact portion of the MEMS probe slides on the support member in a lengthwise direction and therefore does not have a great effect on the support member. However, the other contact portion of the MEMS probe has a bad effect on the support member because of the elastic deformation portion deformed by lengthwise compression, and therefore lowers the contact accuracy and reliability of the MEMS probe.

SUMMARY OF THE INVENTION

An aspect of the present disclosure is conceived to solve the conventional problems, and provide a test probe improved in test reliability by lowering contact resistance and reducing a contact error, and a test device using the same.

In accordance with an embodiment of the present disclosure, there is provided a test probe for solving the foregoing problems. The test probe includes a first contact portion; a second contact portion movable close to or away from the first contact portion; and an elastic deformation portion connecting the first contact portion and the second contact portion and elastically deformed by compression in a probe axial line direction, wherein at least one of the first contact portion and the second contact portion comprises a plurality of split contact portions separated along a lengthwise direction. According to the present disclosure, the plurality of split contact portions are configured to independently contact the tested contact point of the object to be tested, thereby not only enhancing contact reliability but also securing contact reliability by an alternative split contact portion even though one of the split contact portions is defective or damaged.

The elastic deformation portion may comprise a plurality of split deformation portions separated by a slit formed along a lengthwise direction, so that the elastic deformation portion can be deformed and bucked always in a certain direction A separation line for the plurality of split contact portions is extended to the slit, and the split contact portion and the split deformation portion are split as they are a single body, thereby making the slit absorb the deformation force from the plurality of split deformation portions.

The plurality of split contact portions may comprise engagement portions to be engaged in the probe axial line direction or in a direction of traversing the probe axial line, so that the plurality of split contact portions can operate in proper unity.

One among the plurality of split deformation portions includes a second slot formed along the lengthwise direction, thereby not only facilitating elastic deformation but also lowering contact resistance.

There is provided a test device using the foregoing test probes. The test device includes a first support member comprising a plurality of terminal holes; a second support member comprising a plurality of guide holes and spaced apart from and arranged in parallel with the first support member; and a plurality of test probes comprising a first contact portion inserted and supported in the terminal hole, a second contact portion inserted in the guide hole and movable close to and away from the first contact portion, and an elastic deformation portion connecting the first contact portion and the second contact portion and elastically deformed by compression in a probe axial line direction, wherein at least one of the first contact portion and the second contact portion comprises a plurality of split contact portions separated along a lengthwise direction.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF THE INVENTION

Figure 1:
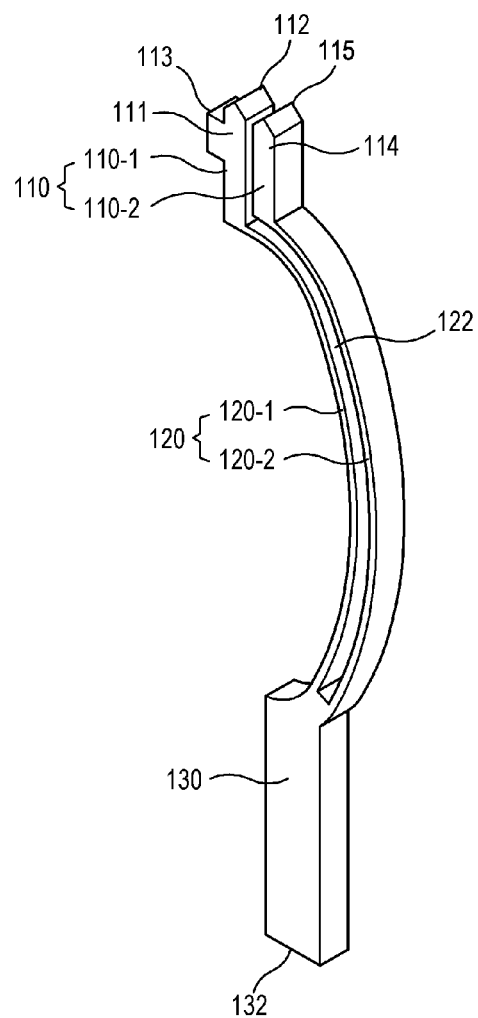
FIG. 1 is a perspective view of a test probe according to a first embodiment of the present disclosure.
Figure 2:
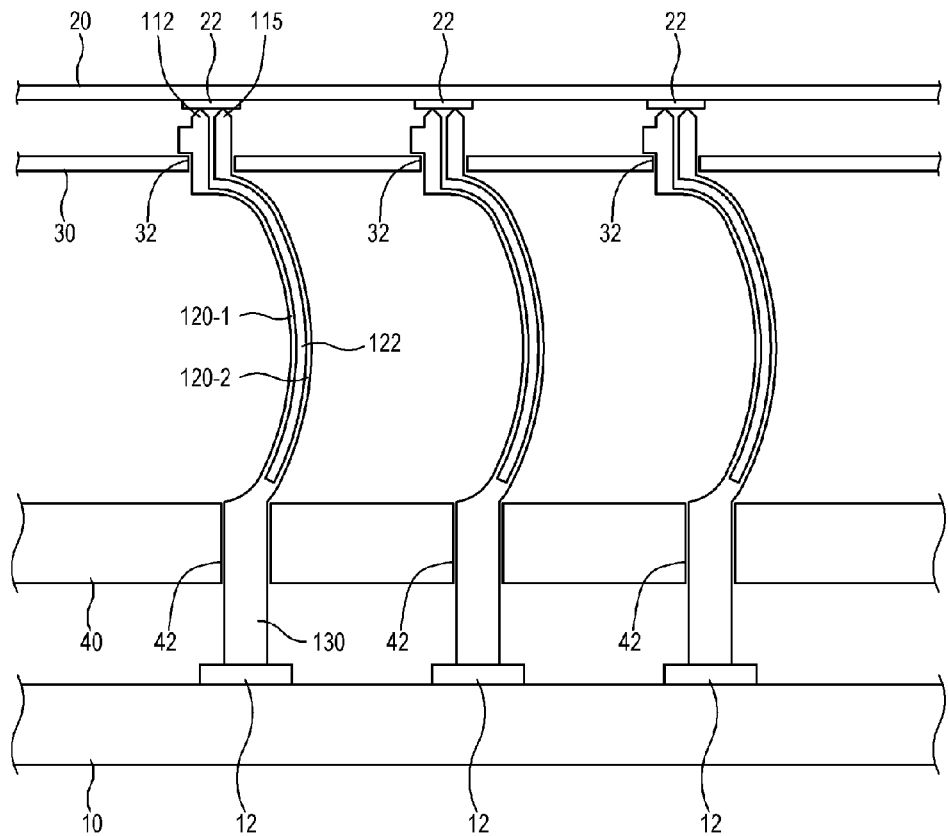
FIG. 2 is a cross-sectional view of a test device using the test probe according to the first embodiment of the present disclosure.

FIG. 1 is a perspective view of a test probe 100 according to a first embodiment of the present disclosure, and FIG. 2 is a cross-sectional view of a test device 1 using the test probe 100 of FIG. 1. As shown therein, the test probe 100 is provided as a plate-shaped conductive member having a predetermined thickness for electric connection between two contact points, for example, between a terminal 12 of an object 10 to be tested and a pad terminal 22 of the interposer 20. Of course, the test probe 100 may be applied for the purpose of electrically connecting any two contact points as well as the electric connection between the object 10 to be tested and the interposer 20. The test probe 100 may be made of palladium (Pd) alloy, Nickel (Ni) alloy, gold (Au), platinum (Pt), silver (Ag), copper (Cu), aluminum (Al), iron (Fe), beryllium (Be), rhodium (Rh), and the like conductive material without limitations. Below, it will be described by way of example that the test probe 100 is used for the connection between the object 10 to be tested and the interposer 20.

The test probe 100 includes a first contact portion 110 to be in contact with the pad terminal of the interposer 20 targeted for contact at one side, a second contact portion 130 to be in contact with the terminal 12 of the object 10 to be tested and targeted for contact at the other side, and an elastic deformation portion 120 deformed between the first contact portion 110 and the second contact portion 130 by compression of the second contact portion 130.

The first contact portion 110 includes two first and second split contact portions 110-1 and 110-2 split along a lengthwise direction. The first and second split contact portions 110-1 and 110-2 are split leaving a space as shown in FIG. 1 by a first slit 117. Of course, the first and second split contact portions 110-1 and 110-2 can be in contact with each other. Further, the first contact portion 110 may include three or more split contact portions. The first split contact portion 110-1 includes a first contact main body 111, a first contact tip 112 formed at the end of the first contact main body 111 and contacting the pad terminal 22 of the interposer 20, and a first projection 113 protruding in a direction of traversing the lengthwise direction of the first contact main body 111. The second split contact portion 110-2 includes a second contact main body 114, and a second contact tip 115 formed at the end of the second contact main body 114 and contacting the pad terminal 22 of the interposer 20. Of course, the second split contact portion 110-2 may selectively include a second projection (not shown) protruding in a direction of traversing the lengthwise direction of the second contact main body 114, like the first split contact portion 110-1.

The elastic deformation portion 120 includes two first and second split deformation portions 120-1 and 120-2 split by a second slit 122 formed along the lengthwise direction. As shown in FIG. 11, the second slit 122 communicates with the first slit between the first and second split contact portions 110-1 and 110-2. In result, a single body of the first split contact portion 110-1 and the first split deformation portion 120-1 is separated from a single body of the second split contact portion 110-2 and the second split deformation portion 120-2 by the first slit 117 and the second slit 122 communicating with each other. Of course, the second slit 122 and the first slit 117 may be discontinuously formed without communicating with each other. The first and second split deformation portions 120-1 and 120-2 are previously formed to have a curvature in a certain direction, for example, in a direction of traversing the lengthwise direction of the first contact portion 110. Like this, the first and second split deformation portions 120-1 and 120-2 are previously formed to have a curvature and therefore deformed always in a certain direction by compression. Here, the first and second split deformation portions 120-1 and 120-2 are not limited to the curved shape, but may be for example linearly formed.

The second contact portion 130 where the first and second split deformation portions 120-1 and 120-2 are converged is linearly extended along a probe axial line.

In the test probe 100 shown in FIG. 1, when the terminal 12 of the object 10 to be tested is pressed against and in contact with an end 132 of the second contact portion 130, the elastic deformation portion 120 pushes the first contact portion 110 toward the pad terminal 22 of the interposer 20 while being deformed in a curved direction, thereby achieving electric conduction for the test.

Figure 3:
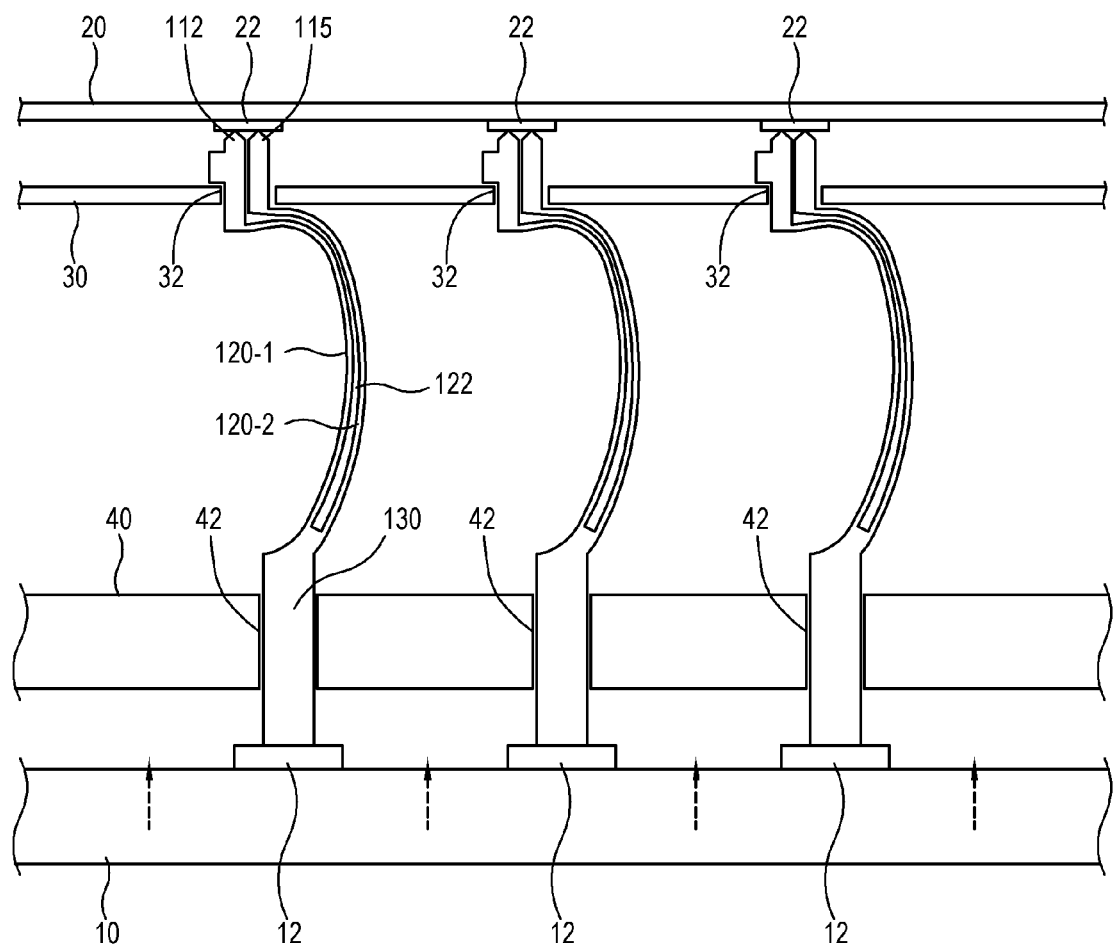
FIG. 3 is a cross-sectional view of the test probe operating during a test in the test device of FIG. 2.

FIG. 2 is a cross-sectional view of the test device 1 using the test probe 100 according to the first embodiment of the present disclosure, and FIG. 3 is a cross-sectional view of the test probe 100 operating during the test in the test device of FIG. 2.

As shown therein, the test device 1 includes a first support member 30 having a plurality of terminal holes 32, a second support member 40 spaced apart from and in parallel with the first support member 30 and having a plurality of guide holes 42, and a plurality of test probes 100, each of which has opposite ends to be inserted in the terminal hole 32 and the guide hole 42.

The first support member 30 is an insulating member shaped like a plate and includes the plurality of terminal hole 32 in which the first and second split contact portions 110-1 and 110-2 of the first contact portion 110 are inserted. The first projection 113 is locked to one side of the first support member 30 so as to restrict the insertion of the first contact tip 112 of the first split contact portion 110-1 into the terminal hole 32.

The second support member 40 is an insulating member shaped like a plate and includes a plurality of guide holes 42 in which the second contact portion 130 is inserted sliding and moving toward the first contact portion 110.

The test probe 100 in this case is equivalent to the test probe 100 shown in FIG. 1, and thus repetitive descriptions thereof will be avoided.

For the test, when the pad terminal 12 of the object 10 to be tested, for example, the semiconductor is pressed against and in contact with the end 132 of the second contact portion 130 of FIG. 2, the second contact portion 130 slides via the guide hole 42 and moves toward the first contact portion 110. First and second split deformation portions 120-1 and 120-2 are deformed in a curved direction as the second contact portion 130 moves. In this case, a deformation amount is not evenly but differently applied to the first and second split deformation portions 120-1 and 120-2. As shown in FIG. 3, during the test, the first split deformation portion 120-1 is deformed so that the width of the second slit 122 can get narrower from the second contact portion 130 toward the first contact portion 110. In result, the first split deformation portion 120-1 and the second split deformation portion 120-2 may be in contact with each other in the proximity of the first support member 30. In this case, the first split contact portion 110-1 moves toward the second split contact portion 110-2. The first contact tip 112 of the first split contact portion 110-1 and the second contact tip 115 of the second split contact portion 110-2 are in contact with each other moving in a direction opposite to the deforming direction of the split deformation portion 120 and pressing the surface of the pad terminal 22 of the interposer 20. Thus, both the first contact tip 112 of the first split contact portion 110-1 and the second contact tip 115 of the second split contact portion 110-2 are in contact with the surface of the pad terminal 22 of the interposer 20, thereby enhancing contact reliability and lowering contact resistance.

Figure 4:
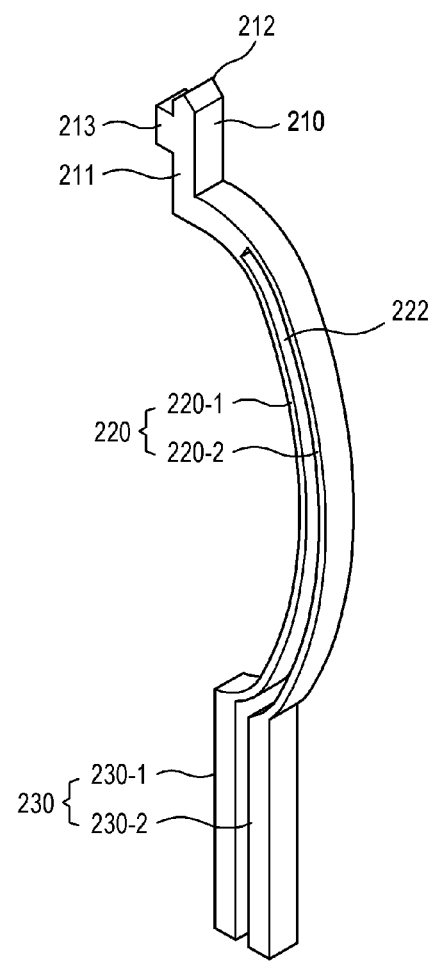
FIG. 4 is a perspective view of a test probe according to a second embodiment of the present disclosure.

FIG. 4 is a perspective view of a test probe 200 according to a second embodiment of the present disclosure. As shown therein, the test probe 200 is provided as a conductive member shaped like a plate having a predetermined thickness, and electrically connects two contact points, for example, the terminal 12 of the object 10 to be tested and the pad terminal 22 of the interposer 20. The test probe 200 may be made of palladium (Pd) alloy, nickel (Ni) alloy, gold (Au), platinum (Pt), silver (Ag), copper (Cu), aluminum (Al), iron (Fe), beryllium (Be), rhodium (Rh), and the like conductive material without limitations. Below, it will be described by way of example that the test probe 200 is provided for electric connection between the object 10 to be tested and the interposer 20.

The test probe 200 includes a first contact portion 210 to be in contact with the pad terminal 22 of the interposer 20 targeted for contact at one side, a second contact portion 230 to be in contact with the terminal 12 of the object 10 to be tested and targeted for contact at the other side, and an elastic deformation portion 220 deformed by compression of the second contact portion 230 between the first contact portion 210 and the second contact portion 230.

The first contact portion 210 includes a first contact main body 211 linearly extended along a probe axial line, a first contact tip 212 formed at the end of the first contact main body 211 and contacting the pad terminal 22 of the interposer 20, and a first projection 213 protruding in a direction traversing the lengthwise direction of the first contact main body 211. Of course, the first contact portion 210 may selectively include a second projection (not shown) at an opposite side to the first projection 213.

The elastic deformation portion 220 includes two first and second split deformation portions 220-1 and 220-2 separated by the second slit 222 formed along the lengthwise direction. The first and second split deformation portions 220-1 and 220-2 are previously formed to have a curvature in a certain direction, for example, in a direction of traversing the lengthwise direction of the first contact portion 210. Like this, the first and second split deformation portions 220-1 and 220-2 are previously formed to have a curvature and therefore deformed always in a certain direction by compression. Here, the first and second split deformation portions 220-1 and 220-2 are not limited to the curved shape, but may be for example linearly formed.

The second contact portion 230 includes two first and second split contact portions 230-1 and 230-2 separated along the lengthwise direction. The first and second split contact portions 230-1 and 230-2 are split leaving a space as shown in FIG. 4 by a first slit 239. Of course, the first and second split contact portions 230-1 and 230-2 can be in contact with each other. Further, the second contact portion 230 may include three or more split contact portions. The first and second split contact portions 230-1 and 230-2 may be spaced apart from or in contact with each other as separated from each other. As shown in FIG. 4, the second slit 222 communicates with the first slit 239 between the first and second split contact portions 230-1 and 230-2 of the second contact portion 230. In result, a single body of the first split contact portion 230-1 and the first split deformation portion 220-1 is separated from a single body of the second split contact portion 230-2 and the second split deformation portion 220-2 by the first slit 239 and the second slit 222 communicating with each other. Of course, the first slit 239 and the second slit 122 may be discontinuously formed.

FIG. 1 illustrates that the first contact portion 110 is split into two first and second contact portions 110-1 and 110-2, and FIG. 4 illustrates that the second contact portion 230 is split into two first and second contact portions 230-1 and 230-2. Alternatively, both the first contact portion 110, 210 and the second contact portion 130, 230 may be separated into two or more pieces. In this case, the second slit 122, 222 of the elastic deformation portion 120, 220 may be configured not to communicate with each first slit 119, 239 of the first contact portion and the second contact portion.

Figure 5:
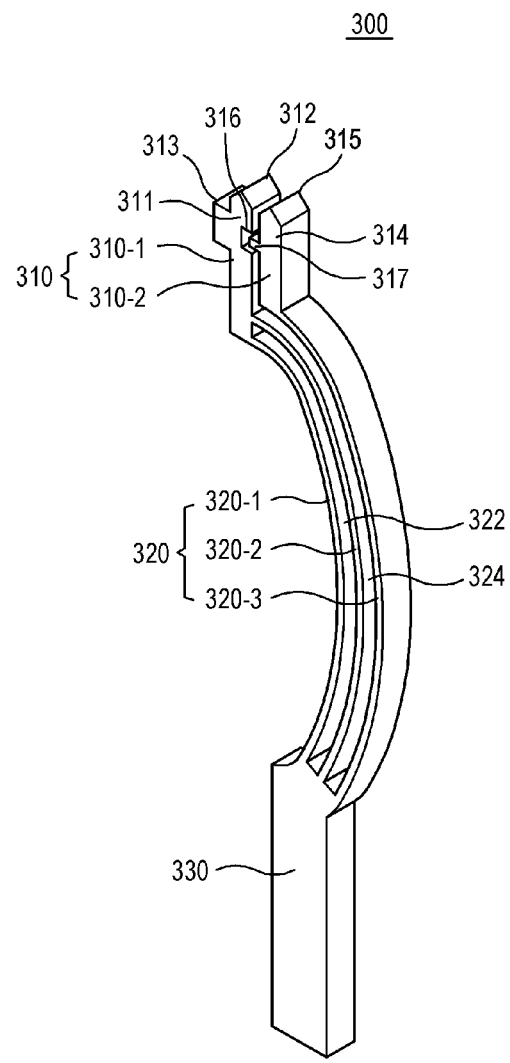
FIG. 5 is a perspective view of a test probe according to a third embodiment of the present disclosure.

FIG. 5 is a perspective view of a test probe 300 according to a third embodiment of the present disclosure. The first support member and the second support member are equivalent to those shown in FIG. 2, and thus repetitive descriptions thereof will be avoided.

The test probe 300 is provided as a conductive member shaped like a plate having a predetermined thickness, and electrically connects two contact point, for example, the terminal 12 of the object 10 to be tested and the pad terminal 22 of the interposer 20. To manufacture the test probe 300, palladium (Pd) alloy, nickel (Ni) alloy, gold (Au), platinum (Pt), silver (Ag), copper (Cu), aluminum (Al), iron (Fe), beryllium (Be), rhodium (Rh), or the like conductive material may be used alone or alloyed as stacked by plating in a thickness direction without limitations. Below, it will be described by way of example that the test probe 300 is provided for electric connection between the object 10 to be tested and the interposer 20.

The test probe 300 includes a first contact portion 310 to be in contact with the pad terminal 22 of the interposer 20 targeted for contact at one side, a second contact portion 330 to be in contact with the terminal 12 of the object 10 to be tested and targeted for contact at the other side, and an elastic deformation portion 320 deformed by compression of the second contact portion 330 between the first contact portion 310 and the second contact portion 330.

The first contact portion 310 includes two first and second split contact portions 310-1 and 310-2 split along the lengthwise direction. The first and second split contact portions 310-1 and 310-2 are spaced part and separated from each other by a first slit 319 as shown in FIG. 5. The first and second split contact portions 310-1 and 310-2 can be in contact with each other. Of course, the first contact portion 310 may include three or more split contact portions. The first split contact portion 310-1 includes a first contact main body 311, a first contact tip 312 formed at the end of the first contact main body 311 and contacting the pad terminal 22 of the interposer 20, and a first projection 313 protruding in a direction of traversing the lengthwise direction of the first contact main body 311. The second split contact portion 310-2 includes a second contact main body 314, and a second contact tip 315 formed at the end of the second contact main body 314 and contacting the pad terminal 22 of the interposer 20. Of course, the second split contact portion 310-2 may selectively include a second projection (not shown) protruding in a direction of traversing the lengthwise direction of the second contact main body 314, like the first split contact portion 310-1. The first contact main body 311 and the second contact main body 314 are formed with engagement portions 316 and 317 on the surfaces thereof facing with each other. That is, as shown therein, the first contact main body 311 includes a concave (凹) portion 316, and the second contact main body 314 includes a convex (凸) portion 317 to be engaged with the concave (凹) portion 316. The concave (凹) portion 316 may have an enough room for making the convex (凸) portion 317 be movable in the probe axial direction even when the convex (凸) portion 317 is inserted therein. Here, the first contact main body 311 may have the convex (凸) portion 317, and the second contact main body 314 may have the concave (凹) portion 316 to receive the convex (凸) portion 317.

The elastic deformation portion 320 includes three first to third split deformation portions 320-1, 320-2 and 320-3 split with a second slit 322 and a third slit 324 formed along the lengthwise direction. As shown in FIG. 5, the second slit 322 is configured to communicate with the first slit 319 formed between the first and second split contact portions 310-1 and 310-2. In result, a single body of the first split contact portion 310-1 and the first and second split deformation portions 320-1 and 320-2 is separated from a single body of the second split contact portion 310-2 and the third split deformation portion 320-3 by the first slit 319 and the second slit 322 communicating with each other. Of course, the first slit 319 and the second slit 322 may be discontinuously formed without communicating with each other. Each of the first to third split deformation portions 320-1, 320-2 and 320-3 is previously formed to have a curvature in a certain direction, for example, in a direction of traversing the lengthwise direction of the first contact portion 310. The third slit 324 is formed between the first and second split deformation portions 320-1 and 320-2 along the lengthwise direction. Alternatively, the first slit 319 and the third slit 324 may communicate with each other, and the second slit 322 may be formed and closed between the second and third split deformation portions 320-2 and 320-3. Further, the elastic deformation portion 320 may include four or more split deformation portion (not shown) with a plurality of slits.

The second contact portion 330 where the first to third split deformation portions 320-1, 320-2 and 320-3 each having a curvature are converged is linearly extended along the probe axial line.

Figure 6:
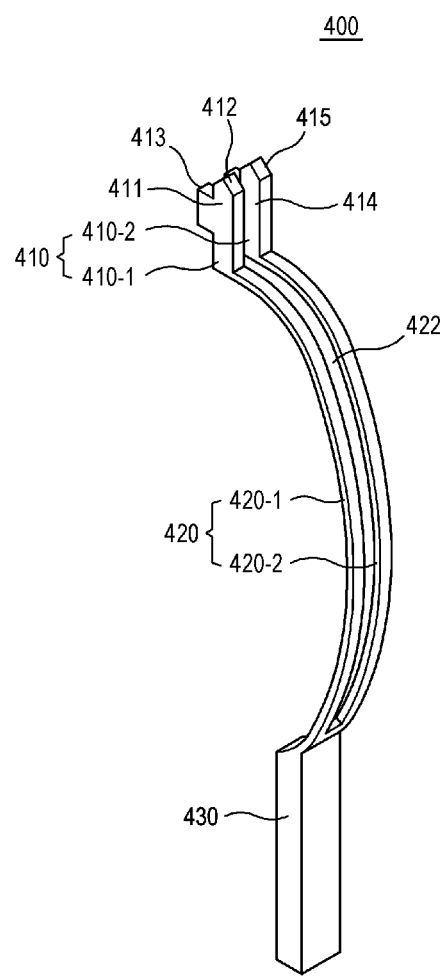
FIG. 6 is a perspective view of a test probe according to a fourth embodiment of the present disclosure.

FIG. 6 is a perspective view of a test probe 400 according to a fourth embodiment of the present disclosure. In the foregoing test probes 100, 200 and 300, the first contact portion 110, 210, 310 and the elastic deformation portion 120, 220, 320 are split along the curved surface. On the other hand, the test probe 400 is split in a direction perpendicular to the curved surface as shown in FIG. 6.

The test probe 400 includes a first contact portion 410 to be in contact with the pad terminal 22 of the interposer 20 targeted for contact at one side, a second contact portion 430 to be in contact with the terminal 12 of the object 10 to be tested and targeted for contact at the other side, and an elastic deformation portion 420 deformed between the first contact portion 410 and the second contact portion 430 by compression of the second contact portion 430.

The first contact portion 410 includes two first and second split contact portions 410-1 and 410-2 split along the lengthwise direction on a plane perpendicular to the curved surface of the elastic deformation portion 420. The first and second split contact portions 410-1 and 410-2 may be separated from each other leaving a space by a first slit 419 as shown in FIG. 6. The first and second split contact portions 410-1 and 410-2 can be in contact with each other. Of course, the first contact portion 410 may include three or more split contact portions. The first split contact portion 410-1 includes a first contact main body 411, a first contact tip 412 formed at the end of the first contact main body 411 and contacting the pad terminal 22 of the interposer 20, and a first projection 413 protruding in a direction of traversing the lengthwise direction of the first contact main body 411. The second split contact portion 410-2 includes a second contact main body 414, a second contact tip 415 formed at the end of the second contact main body 414 and contacting the pad terminal 22 of the interposer 20, and a second projection 416 protruding in a direction of traversing the lengthwise direction of the second contact main body 414.

The elastic deformation portion 420 includes two first and second split deformation portions 420-1 and 420-2 split on a plane perpendicular to the curved surface of the elastic deformation portion 420 by the second slit 422 formed along the lengthwise direction. As shown in FIG. 6, the second slit 422 communicates with the first slit 419. In result, a single body of the first split contact portion 410-1 and the first split deformation portion 420-1 is separated from a single body of the second split contact portion 410-2 and the second split deformation portion 420-2 by the first slit 419 and the second slit 422. Of course, the first and second slits 419 and 422 may be discontinuously formed. The first and second split deformation portions 420-1 and 420-2 are previously formed to have a curvature in a certain direction, for example, in a direction of traversing the lengthwise direction of the first contact portion 410. Like this, the first and second split deformation portions 420-1 and 420-2 are previously formed to have a curvature and therefore deformed always in a certain direction by compression. Here, the first and second split deformation portions 420-1 and 420-2 are not limited to the curved shape, but may be for example linearly formed.

The second contact portion 430 where the first and second split deformation portions 420-1 and 420-2 are converged is linearly extended along a probe axial line.

The fourth embodiment shown in FIG. 6 is advantageous when the width of the pad terminal 22 of the interposer 20, i.e. the width of the elastic deformation portion 420 is large in a direction of traversing the deformation direction.

The test probe and the test device using the same according to the present disclosure have effects as follows.

First, contact reliability is improved by multiple contacts based on a plurality of split contact portions which constitute the contact portion of the test probe Second, even when the contact portion is defective or damaged in the test device using the plurality of test probes, the test is possible using an alternative split contact portion, thereby improving test reliability and durability.

Third, contact resistance is lowered through contact with the plurality of split contact portions.

Fourth, the split deformation portion is easily deformed to thereby improve durability.

Fifth, when the test probe is deformed, effects on the support member for supporting the test probe are reduced, thereby improving test reliability.

Although the present disclosure is described through a few exemplary embodiments and drawings, the present invention is not limited to the foregoing exemplary embodiments and it will be appreciated by a person having an ordinary skill in the art that various modifications and changes can be made from these embodiments.

Therefore, the scope of the present disclosure has to be defined by not the exemplary embodiments but appended claims and the equivalents.

REFERENCE NUMERALS

10: object to be tested
20: interposer
30: first support member
40: second support member
100,200,300,400: test probe
110,210,310,410: first contact portion
110-1,110-2,230-1,230-2,310-1,310-2,410-1,410-2: split contact portion
120,220,320,420: elastic deformation portion
120-1,120-2,220-1,220-2,320-1,320-2,420-1,420-2: split deformation portion
119,219,319,419: first slit
122,222,322,324,422: second slit
130:230,330,430: second contact portion.

What is claimed is:

1. A test probe for testing electric characteristics of an object, the test probe comprising:
a first contact portion;
a second contact portion at an opposite side from the first contact portion; and
an elastic deformation portion connecting the first contact portion and the second contact portion and elastically deformed when the test probe is compressed in an axial line direction of the test probe,
wherein either the first contact portion or the second contact portion comprises a plurality of split contact portions separated by a first slit formed in a lengthwise direction,
wherein the elastic deformation portion comprises a plurality of split deformation portions separated by a second slit formed in a lengthwise direction, the second slit extended from and connected to the first slit.

2. The test probe according to claim 1, wherein the plurality of split contact portions each comprises engagement portions configured to be engaged to one another.

3. The test probe according to claim 2, wherein at least one among the plurality of split deformation portions includes a third slit formed along a lengthwise direction.

4. A test device for testing electric characteristics of an object to be tested, the test device comprising:
a first support member comprising a plurality of terminal holes;
a second support member comprising a plurality of guide holes and spaced apart from and arranged in parallel with the first support member; and
a plurality of test probes each comprising a first contact portion inserted and supported in the terminal hole, a second contact portion inserted in the guide hole and disposed at an opposite side from the first contact portion, and an elastic deformation portion connecting the first contact portion and the second contact portion and elastically deformed when the test probe is compressed in an axial line direction of the test probe,
wherein either the first contact portion or the second contact portion comprises a plurality of split contact portions separated by a first slit formed in a lengthwise direction,
wherein the elastic deformation portion comprises a plurality of split deformation portions separated by a second slit formed in a lengthwise direction, the second slit extended from and connected to the first slit.

5. The test device according to claim 4, wherein the plurality of split contact portions each comprises engagement portions configured to be engaged to one another.

* * * * *